US006636052B2

(12) United States Patent
Hurley et al.

(10) Patent No.: US 6,636,052 B2
(45) Date of Patent: Oct. 21, 2003

(54) APPARATUS AND RELATED METHODS FOR DETECTING INSULATION BREAKDOWN IN INSULATED THROUGH-BOLTS IN POWER GENERATOR

(75) Inventors: Joseph David Hurley, Casselberry, FL (US); Peter Jon Clayton, Casselberry, FL (US)

(73) Assignee: Siemens Westinghouse Power Corporation, Orlando, FL (US)

(*) Notice: Subject to any disclaimer, the term of this patent is extended or adjusted under 35 U.S.C. 154(b) by 138 days.

(21) Appl. No.: 09/924,171

(22) Filed: Aug. 3, 2001

(65) Prior Publication Data

US 2003/0025508 A1 Feb. 6, 2003

(51) Int. Cl.[7] .......................... H04B 3/46; G01R 31/12; G01R 31/14; G01R 31/34; H02K 1/06
(52) U.S. Cl. .................. 324/541; 324/509; 324/536; 324/772; 310/217; 310/68 C
(58) Field of Search .................. 324/541, 509, 324/510, 525, 772, 522, 536; 310/217, 68 C, 68 B, 218, 258; 322/99; 73/865.8, 865.9

(56) References Cited

U.S. PATENT DOCUMENTS

| | | | | | |
|---|---|---|---|---|---|
| 2,823,350 | A | * | 2/1958 | Macleish et al. | 324/523 |
| 3,399,342 | A | * | 8/1968 | Fligel et al. | 324/540 |
| 4,494,030 | A | * | 1/1985 | Mulach et al. | 310/256 |
| 6,496,015 | B2 | * | 12/2002 | Stanford et al. | 324/541 |

* cited by examiner

Primary Examiner—Anjan K. Deb (57) ABSTRACT

An apparatus to detect a breakdown in the insulation of a through-bolt in a laminated generator core is provided. The apparatus provides a ground detection circuit to generate and sense a signal in response to a ground that develops as a result of a breakdown in through-bolt insulation. Preferably, the circuit includes a signal source that generates a signal in response to insulation breakdown and a signal sensor to sense the signal so generated. The apparatus, moreover, can identify which among a plurality of through-bolts has experienced an insulation breakdown. Methods also are provided for detecting a breakdown in through-bolt insulation and identifying which among a plurality of through-bolts has experienced a breakdown in insulation.

19 Claims, 6 Drawing Sheets

APPARATUS AND RELATED METHODS FOR DETECTING INSULATION BREAKDOWN IN INSULATED THROUGH-BOLTS IN POWER GENERATOR

FIELD OF THE INVENTION

This invention is related to the power generation industry and, more particularly to the field of monitoring power generators.

BACKGROUND OF THE INVENTION

Electrical power can be generated by electromagnetic induction using a generator having a rotor which in response to mechanical energy supplied to the generator turns within a stator core. The stator core typically is formed from laminations secured together by a plurality of through-bolts. As the rotor turns within the stator core, a significant amount of flux develops which passes within the core through the through-bolts. As a result of the flux so generated, a voltage is induced across each of the through-bolts within the stator core. If a closed conductive path develops within the core, the voltage across any one of the through-bolts can induce current that will flow through the path within the core. The current can result in serious damage to the core laminations. Thus, to avoid damage to the laminations of the core, the through-bolts securing the laminations to one another often are insulated.

Due to stress from sustained operation of the generator and wear over time, the insulation surrounding any of the through-bolts in the core can breakdown so that the insulation loses its insulating properties thereby causing an unintended ground. The breakdown in insulation can result from a clean tear that extends through the insulation, for example, or from a fraying of portions of the insulation. Along the insulation surface exposed by the breakdown, a conductive path can arise as, for example, as a result of conductive particulate matter on the exposed surface. There can also be arching. In any event, one or more grounds result from the loss of the insulation's insulating properties and a low-impedance path is thereby created for current to flow in the through-bolt and the core laminations. If more than one ground develops owing to the breakdown in the insulation of more than one through-bolt or multiple breakdowns within the insulation of even one through-bolt, multiple grounds will result. When more than one ground occurs, a closed conductive path is formed that can carry core-damaging current induced by the voltage or potential difference produced in each of the through-bolts by the significant amount of flux passing through the core as a result of electromagnetic induction. The current flow, if it occurs, then causes serious damage to the laminations of the stator core that the insulation surrounding the through-bolts was intended to prevent.

SUMMARY OF THE INVENTION

In view of the foregoing, the present invention advantageously provides an apparatus to protect against core-damaging breakdowns in the insulation surrounding portions of a plurality of through-bolts used to secure together the laminations forming a generator core. A distinct advantage of the apparatus is the ability to detect even a single breakdown. This allows the breakdown to be detected prior to any damage to the core. Specifically, each breakdown in insulation causes a ground. If two or more grounds develop, a low-impedance path develops in the core along which core-damaging current can pass. Therefore, by detecting the occurrence of even a single ground, corrective action can be taken before a second ground occurs. Thus, the apparatus indicates the potential for core damage in time for corrective measures before any core damage has occurred. By detecting the first occurrence of insulation breakdown, the substantial cost that would be incurred in replacing an entire current-damaged core is avoided.

Yet a further advantage of the present invention is the ability to identify which through-bolt among a plurality of through-bolts has experienced an insulation breakdown. This allows for corrective action such as replacing the insulation of the affected through-bolt to be directed to the particular insulation of a through-bolt causing the problem. Thus, in addition to providing for the avoidance of the substantial cost of replacing an entire current-damaged core, the apparatus also provides an indication of where corrective action should be directed before any core damage has occurred.

According to the present invention, the apparatus preferably includes a signal source positioned adjacent to or remotely from the generator core. The signal source preferably is connected to an exposed, uninsulated portion of each through-bolt. The signal source is positioned to generate a preselected signal in response to an absence of any breakdown in insulation of any of the through-bolts. The signal source, accordingly, generates an alternative signal in response to a breakdown in the insulation of one of the through-bolts.

The apparatus, moreover, preferably includes at least one signal regulator to regulate the level of the signals generated by the signal source and thereby maintain the signals within predetermined ranges. In addition, a signal sensor is responsive to the signal source to sense a signal generated in response to a breakdown in the through-bolt insulation of at least one through-bolt.

These elements advantageously cooperate to detect a breakdown in the insulation surrounding any one of the through-bolts by detecting even a single ground that develops in the generator core. As already noted, when a breakdown in the insulation of any of the through-bolts occurs, a ground develops. Because of the significant amount of flux passing through the core as a result of electromagnetic induction during operation of the generator, there is voltage or potential difference across each of the through-bolts. Therefore, if two or more grounds develop as a result of a breakdown in the insulation of more than one through-bolt (or multiple breakdowns in even one through-bolt), then a closed, conductive path arises within the core through which current will flow in response to the voltage or potential difference in the through-bolt. The current flow, if it occurs, can cause serious damage to the laminations of the generator core as also already noted.

To avoid damage to the generator core laminations, the apparatus of the present invention detects even a single ground that develops as a result of breakdown in the insulation of a through-bolt. Specifically, the apparatus provides a ground detector circuit in which a signal source is electrically connected to each of the through-bolts. A signal sensor is electrically connected to the signal source. If a single ground occurs due to a breakdown in the insulation of one of the through-bolts, the circuit closes (i.e., the signal source and/or signal sensor are connected to ground) and a signal indicating a breakdown in isolation is generated and detected. Preferably, the signal source is a voltage source and the signal sensor is a current sensor. If a ground develops as a result of insulation breakdown, current is generated through the completed circuit and sensed as a warning that a breakdown in through-bolt insulation has occurred. Conversely, if the insulation surrounding each of the through-bolts is in good working condition, then the circuit is open and no current is induced by the voltage.

More generally, the signal source generates a first signal in response to no breakdown in insulation of any of the through-bolts and, additionally, generates a second signal in response to a even a single breakdown in insulation of any of the through-bolts. To regulate the precise levels of the first and second signals so generated, at least one signal regulator is also provided. Preferably, the at least one signal regulator is provided by a plurality of resistors. Each of the plurality of resistors, moreover, is preferably connected in series between the signal source and a corresponding through-bolt. The resistors substantially prevent current flow between through-bolts via the ground detector circuitry. The resistors, moreover, prevent a solid ground of the through-bolt if the insulation of the ground detector circuit should fail or if the leads from the through-bolts to the ground detector circuit should fail.

In the context of a signal source provided by a direct current voltage that generates a signal in the form of a current in response to a breakdown in insulation of one of the through-bolts, the signal in the form of a direct current, $I_{dc}$, is given by the following equation: $I_{dc} = V_{dc}/(R+R_{gnd})$, where R is the ohmic resistance of a resistor connected in series between the signal source (i.e., direct current voltage) and $R_{gnd}$ is the effective ohmic resistance to ground of the through-bolt experiencing a breakdown in insulation. The specific level of the current $I_{dc}$ can be varied according not only to whether a breakdown in the insulation of a through-bolt has occurred but also in accordance with which of one of the through-bolts has experienced a breakdown in insulation. Thus, more generally, according to the present invention, the apparatus detects a breakdown in insulation in one through-bolt from among a plurality of through-bolts positioned to secure a plurality of core laminations together and provides means for identifying which among the plurality of through-bolts has experienced a breakdown in through-bolt insulation. More generally, the signal source thus generates a first preselected signal in response to no breakdown in insulation among the plurality of through-bolts and a second preselected and regulated signal generated by the signal source and regulated by the signal regulator. The second preselected and regulated signal preferably varies according to which through-bolt experiences a breakdown in insulation. The apparatus preferably also includes an indicator circuit responsive to the signal sensor to generate an indication or otherwise generate an alarm when a signal is generated in response to a breakdown in the insulation surrounding at least one of the through-bolts in the generator core.

Various method aspects for detecting a breakdown in through-bolt insulation surrounding a through-bolt positioned within a generator core are also provided by the present invention. The method preferably includes supplying a current to the generator core, passing the current through the generator core when a breakdown in through-bolt insulation occurs, and detecting the current which is passed through the generator in response to the breakdown in through-bolt insulation. The method aspects, moreover, can further include passing a current through the generator core such that the level of the current passing through the generator core is responsive to whichever of the through-bolts has experienced a breakdown in through-bolt insulation.

In addition, the method aspects of the present invention provide for detecting insulation breakdown in an electrical system by positioning at least one insulated conductor, defining a first conductor positioned within a second conductor, and providing a signal responsive to a breakdown in the insulation of the first conductor. The method also includes providing a plurality of insulated conductors in distinct regions of the second conductor and detecting the region in the second conductor in which a breakdown in insulation occurs.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime and double prime notation, if used, indicate similar elements in alternative embodiments.

Figure 1:
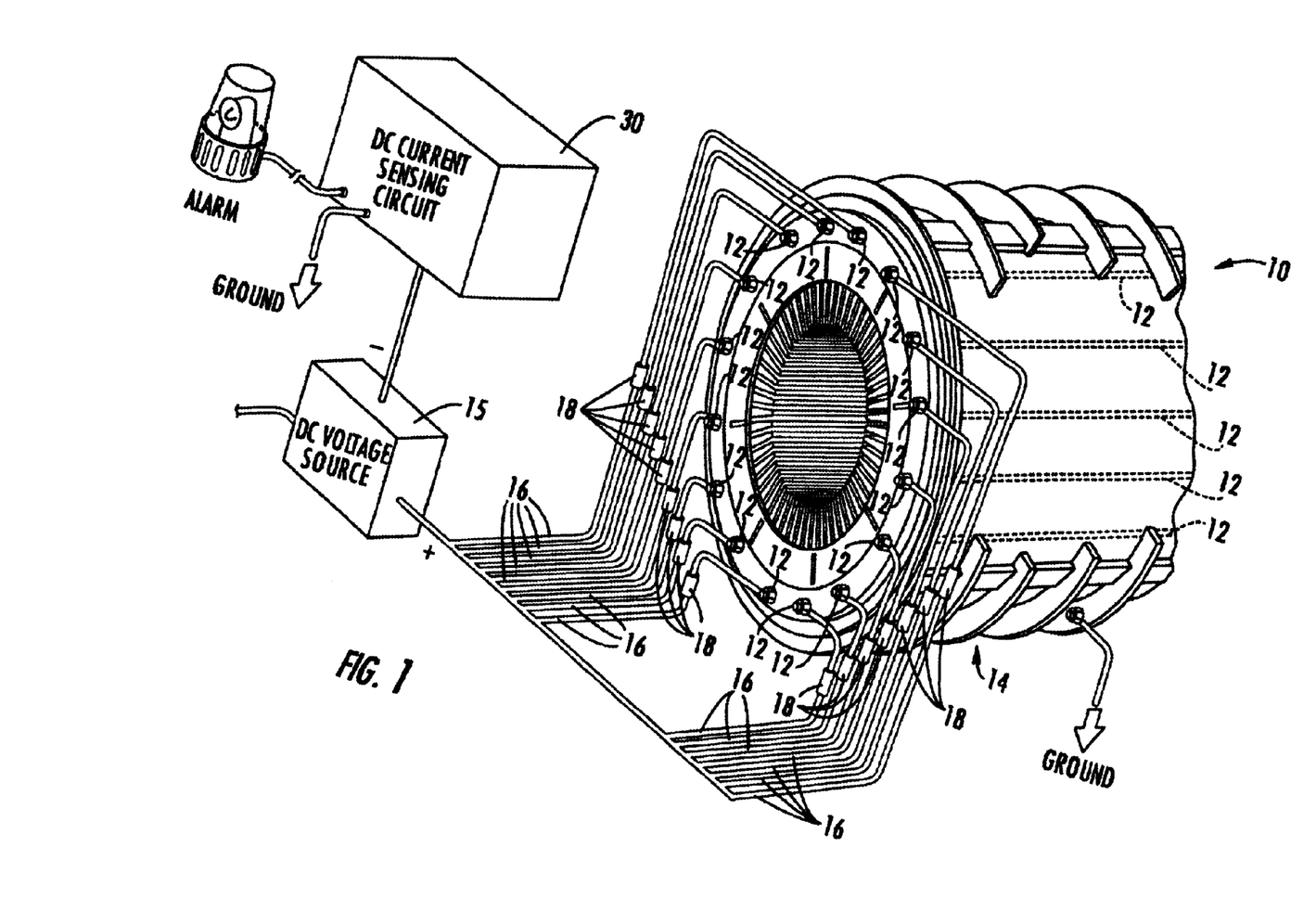
FIG. 1 is a fragmentary perspective view of an apparatus to detect a breakdown in the insulation of a through-bolt in a generator core according the present invention.
Figure 6:
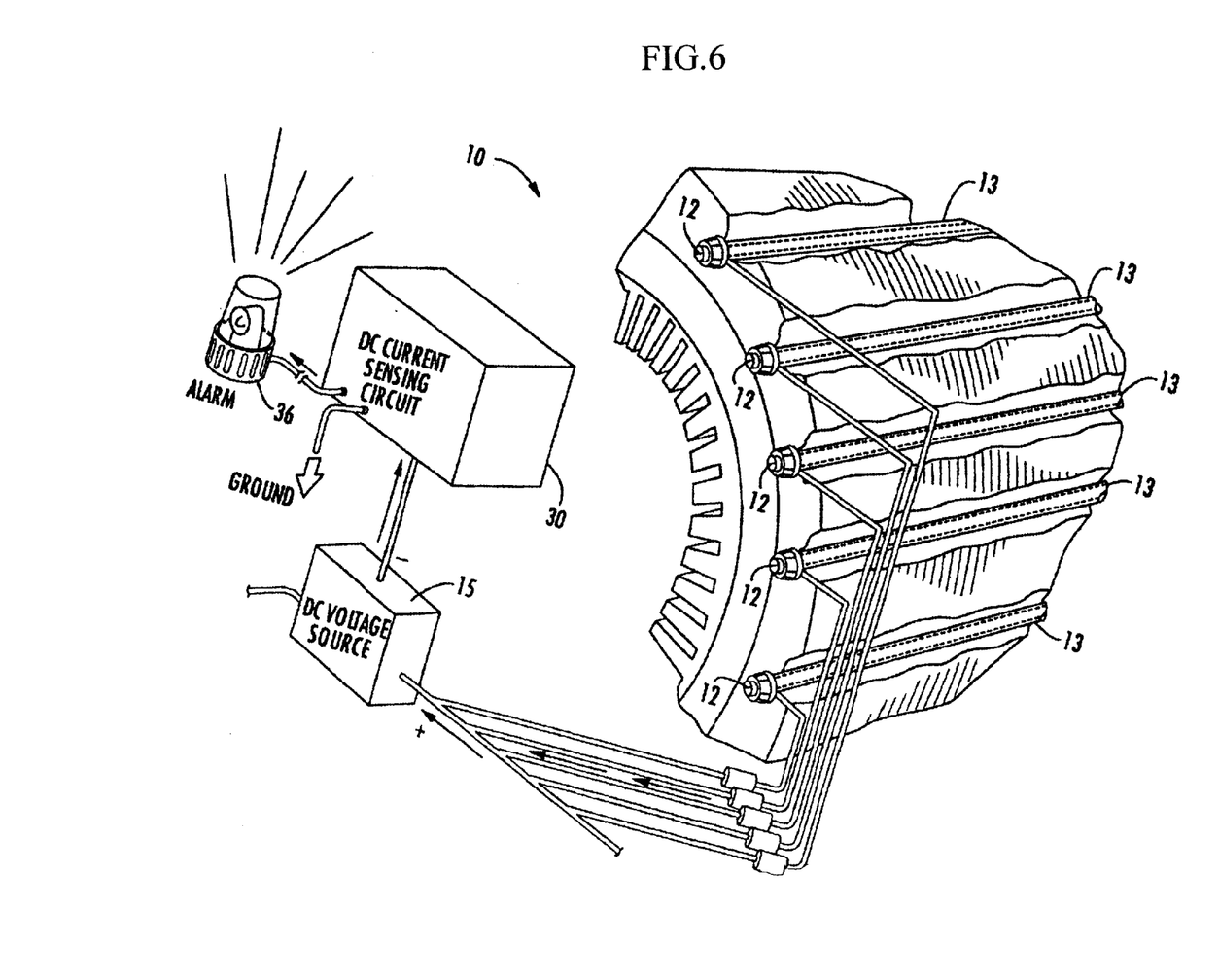
FIG. 6 is a fragmentary perspective view of an apparatus to detect a breakdown according to a first embodiment of the present invention.

FIG. 1 illustrates a first embodiment of an apparatus 10 that provides on-line monitoring of the integrity of the insulation partially surrounding each of a plurality of through-bolts 12 positioned within a laminated generator core 14 such as the stator core of a power generator that provides a high permeability path for magnetism as a rotor turns within the stator core to generate electrical power by means of electromagnetic induction. The generator core 14 preferably is formed of a plurality of laminae secured together by one or more through-bolts 12. The laminae of the generator core 14 are securely clamped together by the through-bolts 12, each of which has insulation 13 surrounding the portion that extends into the generator core 14 (See FIG. 6).

Figure 2:
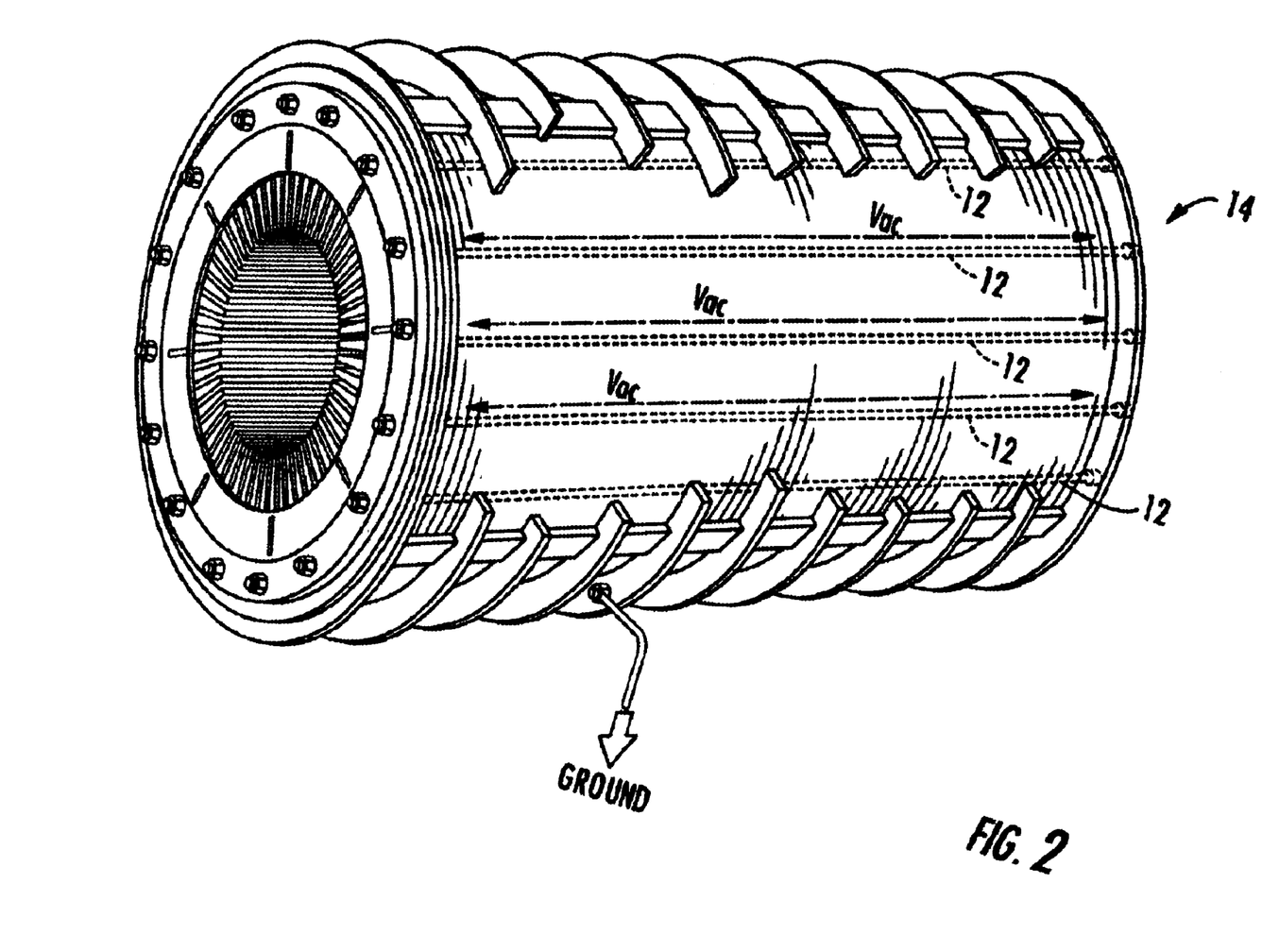
FIG. 2 is a perspective view of a generator core formed of multiple laminations held in place by multiple through-bolts having insulation for which a breakdown can be detected according to the present invention.
Figure 3:
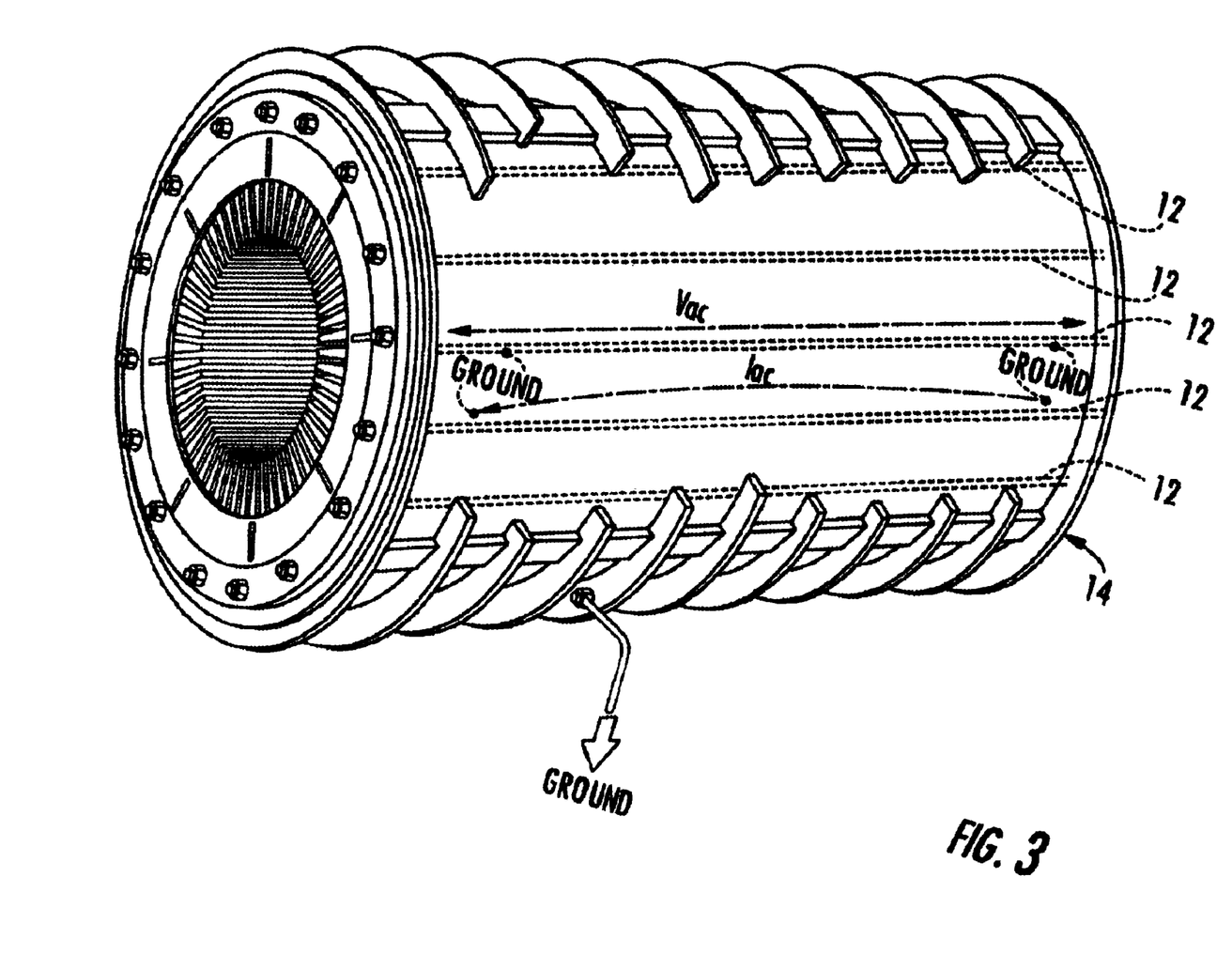
FIG. 3 is a perspective view of a generator core formed of multiple laminations held in place by multiple through-bolts having insulation for which a breakdown has occurred resulting in a current path within the core and which is detected according to the present invention.

As illustrated in FIG. 2, a voltage $V_{ac}$ across each through-bolt 12 develops due to the flux generated in the generator core 14 during operation of the generator. As illustrated in FIG. 3, the insulation must be maintained to prevent the voltage $V_{ac}$ that develops across each through-bolt 12 from damaging the core if at least two grounds develop during operation of the generator. If there is a breakdown in the through-bolt insulation 13 of any one of the through-bolts, the through-bolt will develop a ground. If multiple grounds develop as a result of a breakdown in through-bolt insulation 13, a path is created for core-damaging current $I_{ac}$ (see FIG. 3). The current $I_{ac}$ so generated is of sufficient magnitude to cause melting and other damage to the laminae thereby necessitating that the core 14 be re-stacked. The apparatus 10 of the present invention protects against core damage by detecting even a single breakdown in through-bolt insulation 13 before a current path results from the development of multiple grounds.

Figure 5:
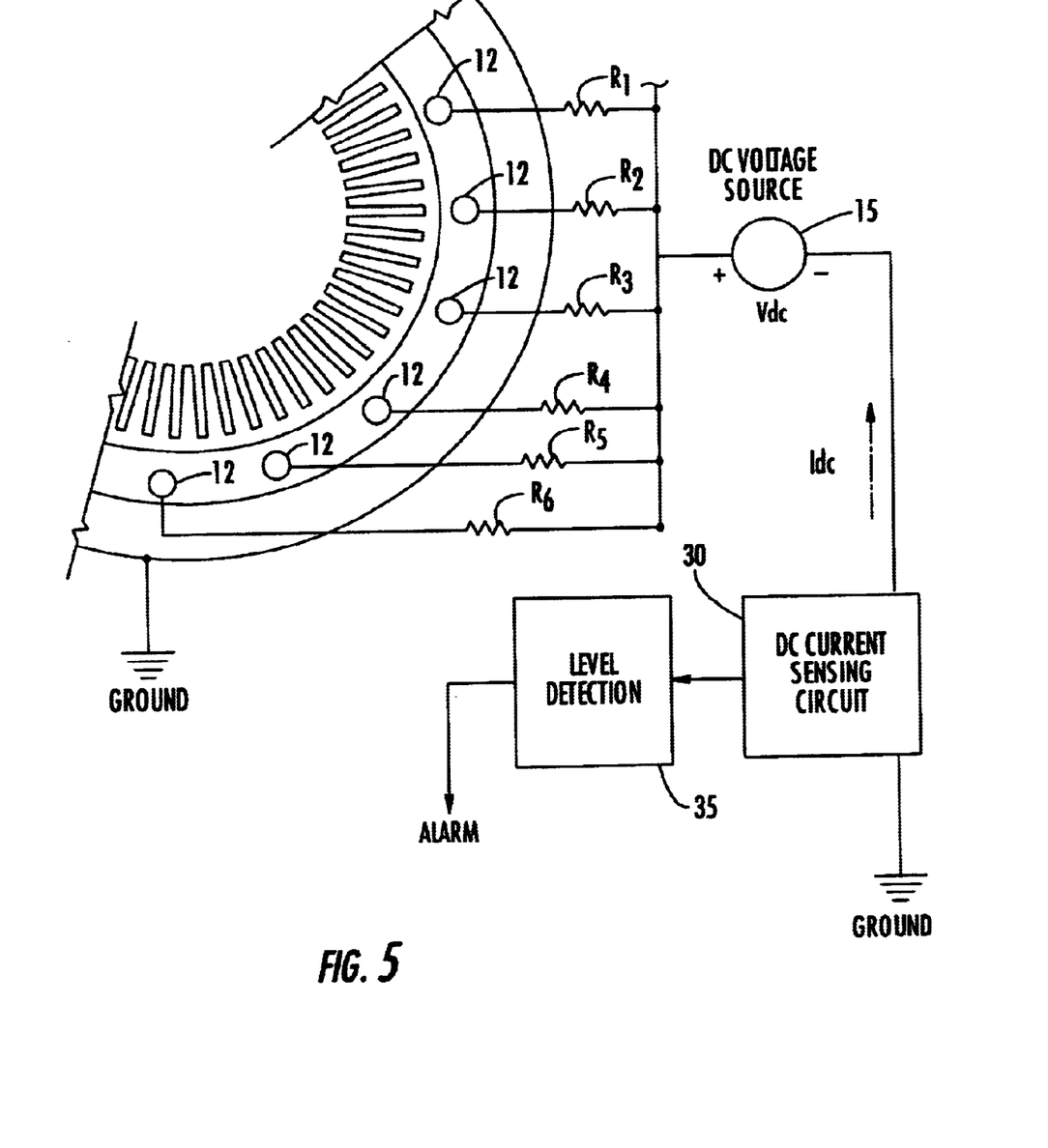
FIG. 5 is a schematic view of a first embodiment of a ground detector circuit of an apparatus for use with a generator core according to the present invention.

According to the present invention, the apparatus 10 preferably includes a signal source 15 and a signal sensor 30 forming elements of a ground detection circuit. As illustrated in FIGS. 1 and 5, the signal source 15 is electrically connected to each of the through-bolts extending into the core 14. More specifically, a conductor 16 extends from the signal source 15 to each of the plurality of through-bolts 12 and connects to a through-bolt portion that extends out from the generator core 14 as illustrated in FIG. 1. The signal source 15, moreover, is electrically connected to the signal sensor 30. The signal sensor 30 that is electrically connected to the signal source 15 is grounded, as explicitly illustrated in FIG. 1. If a ground develops due to a breakdown in insulation 13 of a through-bolt 12 (See, e.g., FIG. 6), then the circuit is complete, and the signal source 15 generates a signal that is transmitted via a conductor 16 to the through-bolt 12 which has developed the ground that completes the circuit. The signal sensor 30 senses the signal so generated. If no breakdown in through-bolt insulation 13 occurs, no ground develops and the circuit remains open precluding the generation of an insulation breakdown-indicating signal.

In one sense, of course, the absence of any signal due to a breakdown in through-bolt insulation is equivalent to a first (i.e., null) signal, while the signal generated in response to a breakdown in through-bolt insulation is equivalent to a second signal. Thus, in this sense the apparatus 10, in general, generates a first signal indicating a normal condition in the core and a second signal indicating a breakdown in through-bolt insulation. More generally, the signal source 15 can generate a range (continuous or discrete) of signals, in which case the apparatus 10 preferably also includes at least one signal regulator 18 electrically connected to the signal source 15 to regulate the level of the signal generated by the signal source 15 as well as a signal level determiner 35 electrically connected to the signal sensor 30 to determine the level of the signal generated by the signal source 15 (see FIGS. 1 and 5).

Preferably, the signal source 15 is a voltage source connected to one or more through-bolts 12 to thereby generate an electrical current defining a signal in response to a breakdown of the insulation of at least one through-bolt 12. Accordingly, the signal sensor 30 preferably includes a current sensing circuit, as understood by those skilled in the art, to sense the presence of an electrical current generated by the signal source responsive to a breakdown in the insulation 13 of the at least one through-bolt 12, and the signal level determiner 35 is a current level determining circuit, as understood by those skilled in the art, to determine the level of current generated by the signal source 15 in response to a breakdown in the insulation of at least one through-bolt 12.

Figure 4:
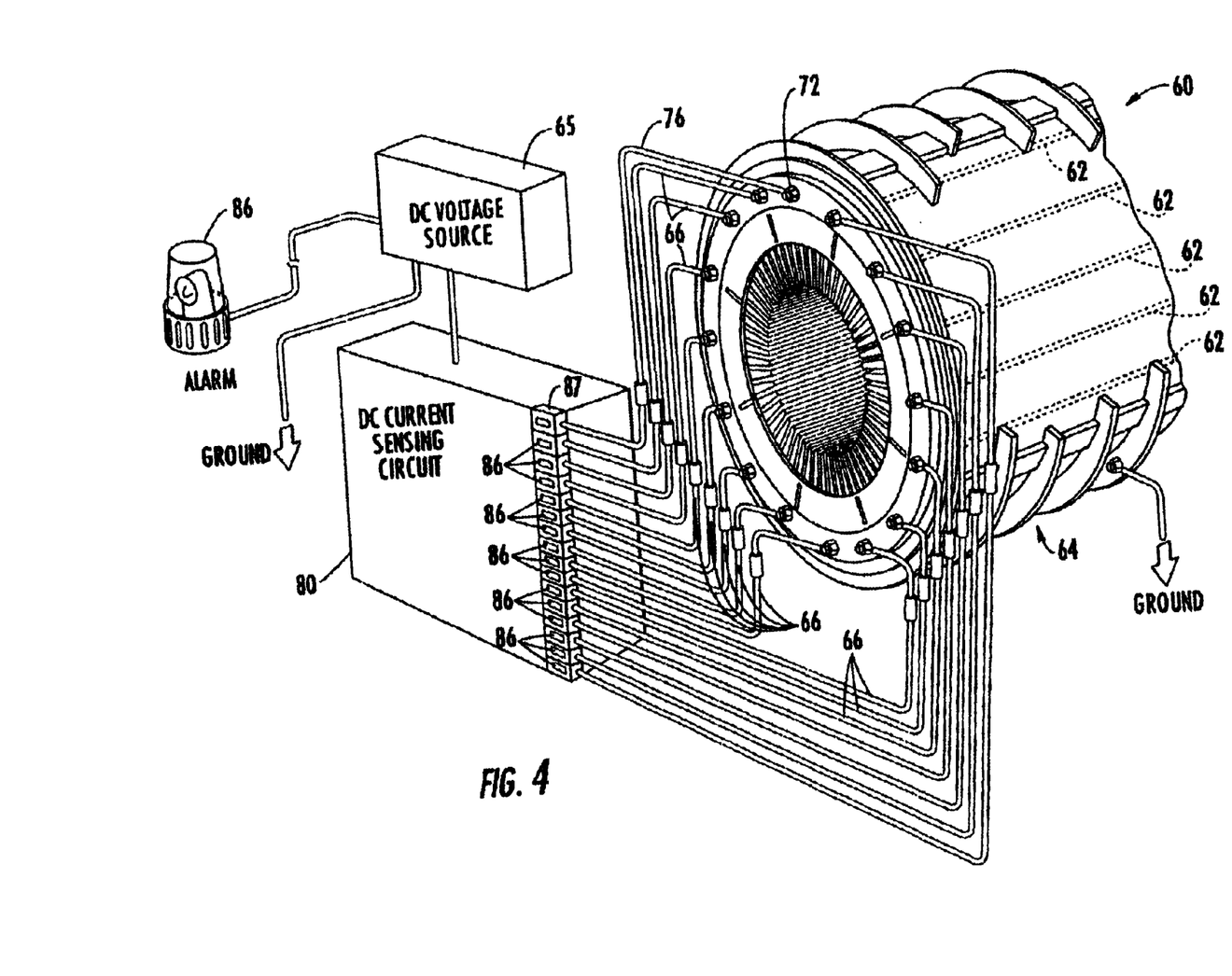
FIG. 4 is a fragmentary perspective view of an apparatus to detect a breakdown in the insulation of a through-bolt in a generator core according to a second embodiment of the present invention.

The signal regulator 18 preferably is a resistor R to prevent any significant flow of electrical current via the circuit, especially between distinct through-bolts 12 in a core 14 having a plurality of through-bolts 12 positioned therein. The resistor R also prevents any solid ground of the through-bolt if the insulation of the circuit or a conductor 16 between the signal source 15 and a through-bolt 12 should fail (See FIG. 6). Preferably, if the apparatus includes a plurality of resistors R, each (or equivalents thereof) preferably is connected in series between the signal source 15 and a corresponding through-bolt 12, and as illustrated in FIG. 4, arranged in parallel with one another. So arranged, then, the resistors R substantially prevent current flow between through-bolts 12 via the circuit. The resistors R, moreover, prevent a solid ground of a through-bolt 12 if the insulation of the ground detector circuit should fail or if the leads from the through-bolts to the ground detector circuit should fail.

If, as described, the signal source 15 is a voltage source $V_{dc}$ that generates a direct current $I_{dc}$, then the current signal generated when a through-bolt ground develops can be computed as follows: $I_{dc}=V_{dc}/(R+R_{gnd})$, where $V_{dc}$ is the voltage level of the source $V_{dc}$, $I_{dc}$ is the level of current $I_{dc}$ generated, R is the ohmic resistance of the resistor R, and $R_{gnd}$ is the effective ohmic resistance to ground of a through-bolt having experienced a breakdown in through-bolt insulation. Thus, by measuring $I_{dc}$, given $V_{dc}$ and R, the effective ground resistance can be estimated on a continuous basis by the corresponding equation $R_{gnd}=(V_{dc}/I_{dc})-R$. Accordingly, as the number of grounds increases, so too, does $I_{dc}$, thereby causing $R_{gnd}$ to decrease in value so that $R_{gnd}$ varies inversely to the number of grounds that develop due to through-bolt insulation breakdown. More succinctly, because $I_{dc}$ increases as the number of grounds due to insulation breakdown increases, $R_{gnd}$ decreases with the number of grounds. Thus, too, the signal generated by the signal source 15 varies according to the number of through-bolts 12 which experience a breakdown in through-bolt insulation.

In addition, the apparatus 10 also provides means for identifying which of the plurality of through-bolts 12 has experienced a breakdown in through-bolt insulation. One such means for doing so can be provided by choosing each of the plurality of signal regulators to be resistors $R_i$ and to choose each of the resistors to have a different ohmic resistance $R_i$. Assuming that the signal source 15 is a dc voltage source, the signal generated is a current that results when, as described above, a ground develops thereby completing the circuit. The level of current $I_{dc}$ depends on which through-bolt has developed a breakdown in insulation and thus provides the current path. That is, the level of current $I_{dc}$ is partially a function of the ohmic resistance $R_i$ of the particular resistor $R_i$ positioned between the voltage source and the through-bolt (see FIG. 5). The level of $I_{dc}$, more precisely, is computed as $I_{dc}=V_{dc}/(R_i+R_{gnd})$. In general, $R_{gnd}$ varies according to where along the insulation of the through-bolt the breakdown occurs as well as the nature of the ground and, more specifically, the resistance of the ground itself. Nonetheless, by compensating for variations in $R_{gnd}$ over a range of values, a precise value $R_i$ for each $R_i$ can be selected so that the level of current $I_{dc}$ indicates which through-bolt 12 has experienced a breakdown in insulation 13.

Alternatively, the means for identifying which of the plurality of through-bolts has experienced a breakdown in through-bolt insulation can be provided by using a manual or automatic switch that opens each current path but one between the signal source and each of the through-bolts. Whenever a signal is received indicating that a breakdown in through-bolt insulation has occurred each current path is closed in sequence. By sequentially performing the operation for each through-bolt, each through-bolt can be individually tested to see whether a breakdown-indicating signal is observed when only one path is provided to that particular through-bolt.

According to still a further alternative the means for identifying which of the plurality of through-bolts has experienced a breakdown in through-bolt insulation, each of the plurality of conductors can be connected to a through-bolt and electrically connected to a through-bolt-specific indicator such as a warning light, light emitting diode (LED) or an audio alarm. Specifically, the warning light, LED, or audio alarm responds to a breakdown in the insulation of the particular through-bolt to which the indicator is directly connected. Thus, the warning light, LED, or audio alarm indicates which through-bolt has experienced a breakdown in insulation whenever a single ground develops as a result of insulation breakdown.

FIG. 4 illustrates a second embodiment of the apparatus 60 in which each of the plurality of through-bolts 62, 72 electrically connects directly to the signal sensor 80 rather than the signal source 65. Moreover, as illustrated, each through-bolt 62, 72 is connected through to a corresponding switch 86, 87. The switch is preferably manually operable to open each conductive path via one conductor 76 and close the path via each remaining conductor 66 in order to determine whether a breakdown-indicating signal indicating being caused by a breakdown in the through-bolt insulation surrounding the through-bolt 72 connected via the closed path through the conductor 76. If, in fact, the breakdown in insulation has not occurred in the insulation surrounding the through-bolt 72, the process can be repeated in order to determine which of the plurality of through-bolts has experienced a breakdown in through-bolt insulation. In both the first and second embodiments, the apparatus 10, 60 preferably also includes an insulation breakdown indicator 36, 86 that indicates a breakdown has occurred in the through-bolt insulation of at least one through-bolt. As illustrated in FIGS. 1 and 4, the insulation breakdown indicator 36 can be electrically connected to the signal sensor 15, 85. Alternatively, however, the insulation breakdown indicator can be electrically connected to the signal level determiner 35. The insulation breakdown indicator 36, 86 can be any one of a number of signal indicators well known to those skilled in the art, including, for example one or more warning lights or alternatively, an array of LEDs an audio alarm having one or more sounds emitted therefrom, or other various types of indicators as understood by the skilled in the art.

FIGS. 1–6, moreover, illustrate the method aspects of the present invention. These aspects include a method for detecting a breakdown in through-bolt insulation surrounding a through-bolt positioned within a generator core. The method for detecting a breakdown in through-bolt insulation preferably includes supplying a signal to the generator core and detecting the signal when a breakdown in through-bolt insulation occurs. The step of supplying a signal, moreover, encompasses generating an electrical current when a breakdown in through-bolt insulation occurs. In addition, according to the method aspects of the invention, the step of detecting the signal encompasses detecting the current so generated.

The method aspects of the present invention also include a method to detect insulation breakdown in an electrical system. The method preferably includes positioning at least one insulated conductor, defining a first conductor, in a second conductor, and providing a signal in response to a breakdown in the insulation of the first conductor. In the context of a power generator, for example, the first conductor comprises at least one through-bolt having insulation at least partially surrounding the at least one through-bolt, and the second conductor is the laminated core held together by the at least one insulated through-bolt. The same method, though preferably applied in the context of power generators, can also be utilized with various other types of devices having insulation separating two or more conductors. The method, moreover, can further include varying the level of the signal provided according to the number of insulation breakdowns that occur. Another method aspect of the present invention encompasses providing a plurality of insulated conductors in distinct regions of the second conductor and detecting the region in the second conductor in which a breakdown in insulation occurs.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. An apparatus to detect a breakdown in through-bolt insulation at least partially surrounding at least one insulated through-bolt positioned within a power generator, the apparatus comprising:
   a generator core formed of a plurality of core laminations secured to each other by the at least one insulated through-bolt;
   a signal source electrically connected to the at least one insulated through-bolt to generate a signal responsive to a breakdown in the through-bolt insulation of the at least one insulated through-bolt;
   at least one signal regulator electrically connected to the signal source to regulate the level of the signal generated by the signal source;
   a signal sensor electrically connected to the signal source to sense the signal generated by the signal source responsive to a breakdown in the through-bolt insulation of the at least one insulated through-bolt;
   a signal level determiner responsive to the signal sensor to determine the level of the signal generated by the signal source; and
   an insulation breakdown indicator responsive to the signal level determiner to indicate a breakdown in the through-bolt insulation of the at least one insulated through-bolt.

2. An apparatus to detect a breakdown in through-bolt insulation as defined in claim 1, wherein the signal source comprises a voltage source connected to the at least one insulated through-bolt to thereby generate an electrical current defining a signal responsive to a breakdown of the insulation of the at Least one insulated through-bolt.

3. An apparatus to detect a breakdown in through-bolt insulation as defined in claim 2, wherein the signal sensor comprises a current sensing circuit positioned to sense the electrical current generated by the signal source responsive to a breakdown in the insulation of the at least one insulated through-bolt.

4. An apparatus to detect a breakdown in through-bolt insulation as defined in claim 3, wherein the signal level determiner comprises a current level determining circuit positioned to determine a level of current generated by the signal source responsive to a breakdown in the insulation of the at least one insulated through-bolt.

5. An apparatus to detect a breakdown in through-bolt insulation as defined in claim 4, wherein the at least one signal regulator comprises a resistor electrically connected to the signal source and to the at least one insulated through-bolt.

6. An apparatus to detect a breakdown in through-bolt insulation as defined in claim 4, wherein the at least one insulated through-bolt comprises one of a plurality of through bolts securing the plurality of core laminations and the at least one signal regulator comprises one of a plurality of signal regulators each respectively connected to a corresponding one of the plurality of insulated through-bolts, and wherein the signal generated by the signal source varies according to the number of breakdowns in through-bolt insulation.

7. An apparatus to detect a breakdown in through-bolt insulation as defined in claim 4, wherein the at least one insulated through-bolt comprises one of a plurality of insulated through-bolts securing the plurality of core laminations and the at least one signal regulator comprises one of a plurality of signal regulators each respectively connected to a corresponding one of the plurality of insulated through-bolts, and wherein the signal sensor further includes means for identifying which of the plurality of insulated through-bolts has experienced a breakdown through-bolt insulation and which of the plurality of insulated through-bolts has not experienced a breakdown in through-bolt insulation.

8. An apparatus to detect a breakdown in through-bolt insulation at least partially surrounding at least one insulated through-bolt positioned within a generator core having a plurality of core laminations secured to each other by the at least one insulated through-bolt, the apparatus comprising:
  a signal source electrically connected to the at least one insulated through-bolt to generate a signal responsive to a breakdown in the through-bolt insulation of the at least one insulated through-bolt,
  a signal sensor electrically connected to signal source to sense the signal generated by the signal source responsive to a breakdown in the through-bolt insulation of the at least one insulated through-bolt; and
  an insulation breakdown indicator responsive to the signal source to generate an indication of a breakdown in the through-bolt insulation of the at least one insulated through-bolt.

9. An apparatus to detect a breakdown in through-bolt insulation as defined in claim 8, wherein the signal source comprises a voltage source connected to the at least one insulated through-bolt to thereby generate an electrical current defining a signal responsive to a breakdown of the insulation of the at least one insulated through-bolt.

10. An apparatus to detect a breakdown in through-bolt insulation as defined in claim 9, wherein the signal sensor comprises a current sensing circuit positioned to sense the electrical current generated by the signal source responsive to a breakdown in the insulation of the at least one insulated through-bolt.

11. A ground detector circuit adapted to detect a ground in a generator core resulting from a breakdown in through-bolt insulation at least partially surrounding at least one insulated through-bolt positioned within the generator core, the circuit comprising:
  a signal source adapted to connect to the at least one insulated through-bolt to generate a signal responsive to the ground resulting from a breakdown in the through-bolt insulation of the at least one insulated through-bolt; and
  a signal sensor responsive to the signal generated by the signal source.

12. A ground detector circuit as defined in claim 11, wherein the signal source comprises a voltage source connected to the at least one insulated through-bolt to thereby generate an electrical current defining a signal responsive to a ground resulting from a breakdown in the insulation of the at least one insulated through-bolt.

13. A ground detector circuit adapted to detect a breakdown in through-bolt insulation as defined in claim 12, wherein the signal sensor comprises a current sensing circuit positioned to sense the electrical current generated by the signal source responsive to a breakdown in the insulation of the at least one insulated through-bolt.

14. A ground detector circuit as defined in claim 13, wherein the circuit further comprises a signal level determiner electrically responsive to the signal sensor to determine a level of the signal generated by the signal source.

15. A ground detector circuit as defined in claim 14, wherein the circuit further comprises an insulation breakdown indicator responsive to the signal level determiner to generate an indication of a ground resulting from a breakdown in the through-bolt insulation of the at least one insulated through-bolt.

16. A ground detector circuit as defined in claim 15, wherein the signal source is adapted to connect to a plurality of insulated through-bolts, wherein the at least one signal regulator comprises one of a plurality of resistors, each resistor adapted to connect to a corresponding one of the plurality of insulated through-bolts, and wherein the level of the signal generated by the signal source varies according to the number of grounds that develop as a result of through-bolt insulation breakdown.

17. A ground detector circuit as defined in claim 16, wherein the circuit further comprises means for identifying which of the plurality of insulated through-bolts has experienced a breakdown in through-bolt insulation and which of the plurality of insulated through-bolts has not experienced a breakdown in through-bolt insulation.

18. A method for detecting a breakdown in through-bolt insulation surrounding substantially the entire length of a through-bolt positioned within a generator core, the method comprising supplying a signal to the generator core and detecting the signal when a breakdown in through-bolt insulation occurs.

19. A method as defined in claim 18, wherein the step of supplying a signal comprises generating an electrical current when a breakdown in through-bolt insulation occurs, and wherein the step of detecting the signal comprises detecting the current.

* * * * *